United States Patent
Yoshikawa et al.

(10) Patent No.: US 6,533,162 B2
(45) Date of Patent: Mar. 18, 2003

(54) PASTE PROVIDING METHOD, SOLDERING METHOD AND APPARATUS AND SYSTEM THEREFOR

(75) Inventors: Fumio Yoshikawa, Hadano (JP);
Hideyuki Fukasawa, Hadano (JP);
Mitsugu Shirai, Hadano (JP); Hideaki Sasaki, Hadano (JP); Toshitaka Murakawa, Hadano (JP); Kenichi Hamamura, Isehara (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/733,096

(22) Filed: Dec. 11, 2000

(65) Prior Publication Data

US 2001/0000906 A1 May 10, 2001

Related U.S. Application Data

(62) Division of application No. 09/102,212, filed on Jun. 22, 1998, now Pat. No. 6,193,144.

(30) Foreign Application Priority Data

Jul. 23, 1997 (JP) ............................................. 9-212633

(51) Int. Cl.⁷ ............................. B23K 31/02; B23K 1/20
(52) U.S. Cl. .................. 228/180.1; 228/214; 228/248.1
(58) Field of Search ..................... 228/180.21, 248.1, 228/256, 33, 248.5, 245, 214, 180.1; 427/96

(56) References Cited

U.S. PATENT DOCUMENTS

| | | | |
|---|---|---|---|
| 4,822,640 A | 4/1989 | Tuhkanen et al. | 427/211 |
| 4,906,823 A | 3/1990 | Kushima et al. | 228/245 |
| 4,919,970 A | 4/1990 | Hoebener et al. | 427/96 |
| 5,429,293 A | 7/1995 | Bradley III et al. | 228/180.22 |
| 5,532,070 A | 7/1996 | Takahashi et al. | 428/643 |
| 5,660,632 A | 10/1997 | Volpe, Jr. et al. | 118/213 |
| 5,775,219 A | 7/1998 | Simazu et al. | 101/123 |
| 5,826,516 A | 10/1998 | Shimazu et al. | 101/483 |
| 5,948,130 A | 9/1999 | Ostendarp | 65/44 |
| 5,988,856 A | 11/1999 | Braunstein et al. | |
| 6,025,258 A | 2/2000 | Ochiai et al. | 438/613 |
| 6,193,144 B1 * | 2/2001 | Yoshikawa et al. | |

FOREIGN PATENT DOCUMENTS

| | | |
|---|---|---|
| JP | 57-104294 | 6/1982 |
| JP | 63-119977 | 5/1988 |
| JP | 5-337425 | 12/1993 |
| JP | 406127165 | 5/1994 |
| JP | 6-155708 | 6/1994 |
| JP | 409109365 | 4/1997 |

* cited by examiner

Primary Examiner—Tom Dunn
Assistant Examiner—Kiley Stoner
(74) Attorney, Agent, or Firm—Antonelli, Terry, Stout & Kraus, LLP

(57) ABSTRACT

An improved soldering system which reduces the numbers of steps for paste supply and soldering in soldering lead provided parts and surface mounting parts onto a printed circuit board. A printed circuit board has through holes through which a lead of each lead provided part is to be inserted and lands for surface mounting parts. A printing mask is matched with the through holes and lands and a paste receiving plate having holes to which solder paste is to be supplied corresponding to each of the through holes is disposed. A printing roller is swept by forcibly rotating it so as to fill with solder paste, then a printing squeegee is swept following that printing roller so as to further fill with solder paste. Parts are loaded on the through holes and lands of the printed circuit board loaded with solder paste and reflowing is carried out on the printed circuit board and paste receiving plate at the same time, so that the lead provided parts and surface mounting parts are soldered to the printed circuit board at the same time.

9 Claims, 5 Drawing Sheets

FIG. 5a

PRINTING CONDITION TABLE

| NO. | PRINTING ITEM | ROLLER A | ROLLER B | ROLLER C | FLAT SQUEEGEE |
|---|---|---|---|---|---|
| 1 | PRINTING FREQUENCY | 1 TIME | ← | ← | ← |
| 2 | PRINTING SPEED(mm/s) | 5 | ← | ← | ← |
| 3 | ROLLER PERIPHERAL VELOCITY(mm/s) | 20 | 5 | 0 | — |
| 4 | ROLLER DIAMETER (ø) | 42 | ← | ← | — |
| 5 | FILLING RATIO (BOARD WIDTH TH STANDARD : 1) | 2.5 | 1.13 | 0.85 | 0.4 |

FIG. 5b

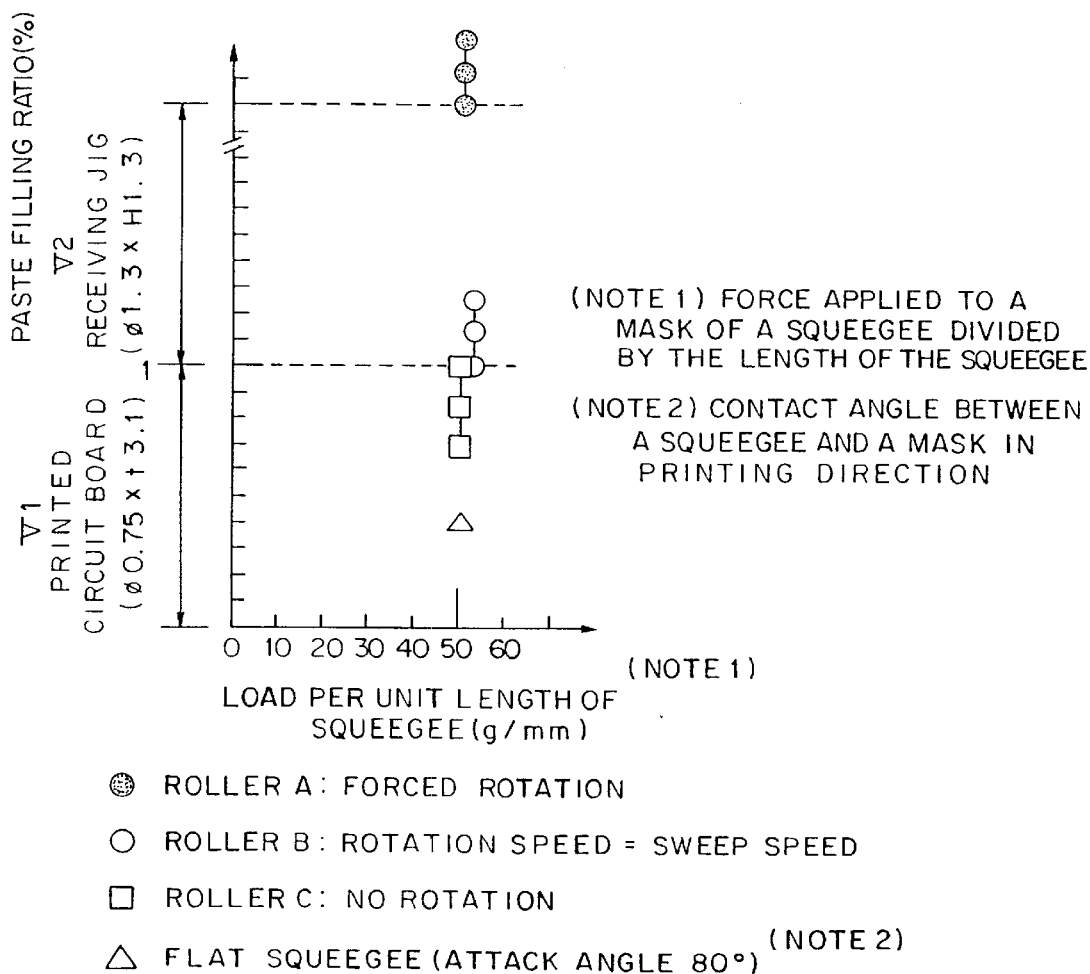

(NOTE 1) FORCE APPLIED TO A MASK OF A SQUEEGEE DIVIDED BY THE LENGTH OF THE SQUEEGEE (NOTE 2) CONTACT ANGLE BETWEEN A SQUEEGEE AND A MASK IN PRINTING DIRECTION

- ROLLER A: FORCED ROTATION
- ROLLER B: ROTATION SPEED = SWEEP SPEED
- ROLLER C: NO ROTATION
- FLAT SQUEEGEE (ATTACK ANGLE 80°) (NOTE 2)

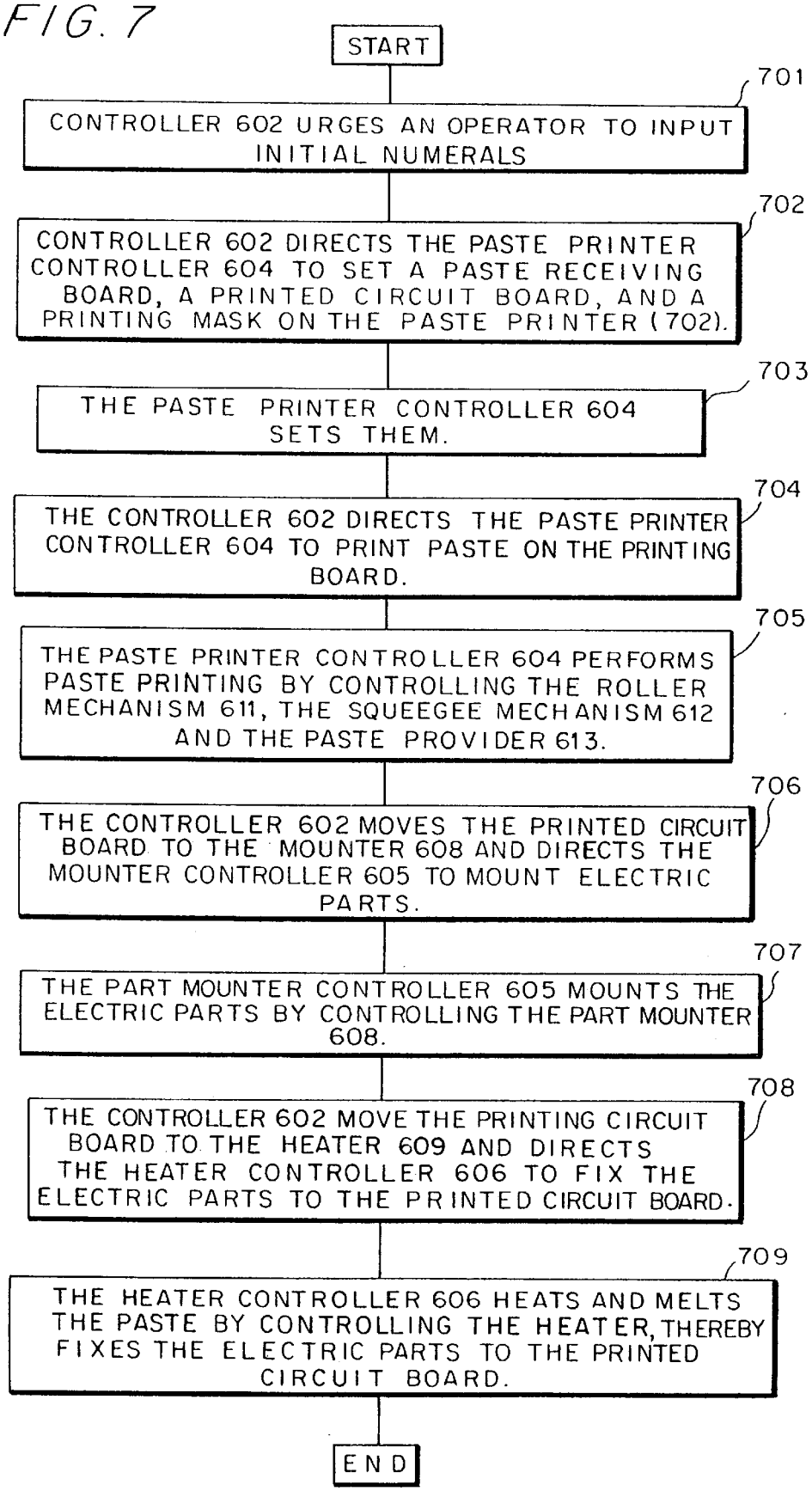

PASTE PROVIDING METHOD, SOLDERING METHOD AND APPARATUS AND SYSTEM THEREFOR

This is a divisional of application Ser. No. 09/102,212, filed Jun. 22, 1998 now U.S. Pat. No. 6,193,144.

BACKGROUND OF THE INVENTION

This invention relates to a method, apparatus and system for filling through holes made in a printed circuit board or the like with paste-like substance, and a method, apparatus and system for soldering the printed circuit board or the like filled with the paste-like substance. More particularly this invention relates to a method, apparatus and system for filling the through holes with paste-like substance using a roller with adding power for rotating the roller.

Various methods for printing solder paste on a surface mounting land of a printed circuit board have been disclosed up to now.

In the solder paste printing, usually a mask having openings corresponding to predetermined positions of the printed circuit board is used. By sweeping (dragging) a squeegee, solder paste suitable for the openings is supplied to the printed circuit board through a mask.

In a printed circuit board substrate in which the surface mounting parts land and through holes coexist, as well known, according to one prior method, the solder paste is supplied to the surface mounting part land, and after surface mounting parts are loaded thereon, reflowing is carried out. After that, a lead of each lead provided insertion part is inserted into a through hole coated with flux and soldering is carried out using wave solder. This method requires at least two processes, that is, a process for soldering surface mounting parts by reflowing and a process for soldering lead provided insertion parts with wave solder.

According to this method, a number of reflow frequencies is increased in some types of printed circuit boards loaded with parts and therefore thermal shock to the substrate increases, so that the reliability of the substrate drops. Further, floating of chip parts and the necessary steps for masking with tape or the like cause the increase of the number of steps for mounting process.

According to the prior method, it is impossible to complete soldering with a single reflow by supplying solder paste to the surface mounting land and through holes at the same time, of a substrate in which the surface mounting parts and lead provided insertion parts coexist.

Further because solder volume is reduced about half after the solder is melted, solder paste more than twice a volume of a through hole needs to be supplied to the through hole. Further as the aspect ratio (ratio between a through hole diameter and substrate thickness) increases, it is more difficult to fill with solder paste.

Another prior art method is described in Japanese patent laid open number H05-33742. The document discloses a filling device for filling viscous tungsten paste into a through hole formed on a green sheet. The filling device has a roller squeegee and scrapers for scraping the paste. However the roller squeegee must be forced to rotate. Further the filling device can not supply enough of the paste to the through holes.

SUMMARY OF THE INVENTION

An object of the present invention is to provide a method, apparatus and system for supplying solder paste sufficiently to through holes of lead provided parts of a printed circuit board or the like.

Another object of the present invention is to provide a method, apparatus and system for supplying solder paste sufficiently to surface mounting part land and lead provided through holes on a circuit board having a large thickness in which surface mounting parts and lead provided insertion parts coexist at a time.

Still another object of the present invention is to provide a method, apparatus and system for soldering parts with a single reflow to a printed circuit board having a large thickness in which the surface mounting parts and lead provided insertion parts coexist.

To achieve the above objects, according to the present invention, there is provided a paste filling method, apparatus and system for supplying paste-like substance to any through holes formed in an article. The invention provides first, setting a printing mask, which has predetermined openings corresponding to the through holes on the article. Then providing the paste-like substance on the printing mask, and dragging a roller, which is forced to rotate independent of dragging motion, along a surface of the printing mask. After that, removing the printing mask from the article.

According to a further embodiment, the rotation of the roller is carried out so that a peripheral velocity of the roller rotation is a different speed with respect to the roller dragging speed. Preferably the rotation of the roller is carried out so that the peripheral velocity of the roller is faster than the roller sweeping speed.

The invention can be used on articles wherein surface mounting part lands are provided on the article in addition to the through holes so that the paste-like substance is supplied to the through holes and the surface mounting part lands.

According to another aspect of the present invention, there is provided a paste filling method, apparatus and system for supplying paste-like substance to through holes and surface mounting part lands provided arbitrarily on an article, including the steps of matching a printing mask having predetermined openings for through holes and surface mounting part lands therewith in the article and sweeping a roller by rotating the roller independent of the sweeping motion and further sweeping a follow-up squeegee so as to supply the paste-like substance to the through holes. A paste receiving plate is disposed corresponding to the through holes and the surface mounting part lands.

According to still another aspect of the present invention, there is provided a soldering method, apparatus and system for soldering parts on a printed circuit board having through holes and surface mounting part lands. The invention provides for first, matching a printing mask having predetermined openings for the through holes and surface mounting part lands with the printed circuit board. Then, sweeping a roller by rotating the roller and further sweeping a follow-up squeegee so as to supply solder paste to the through holes. A paste receiving plate is disposed corresponding to the through holes and the surface mounting part lands. After loading parts on the surface mounting part lands of the printed circuit board and inserting leads of the parts into the through holes, heating and melting solder paste with the printed circuit board and the paste receiving plate as a set, so as to carry out soldering.

According to the present invention, it is possible to supply paste-like substance to high aspect ratio through holes. It is also possible to supply paste-like substance to the surface and through holes of an article in a time.

Further, in mounting parts onto a printed circuit board according to the present invention, soldering can be carried out by supplying solder paste, loading parts and then melting the solder. As a result, in a printed circuit board in which lead provided parts having leads to be inserted into each through hole and surface mounting parts coexist, the number of steps for mounting process can be substantially reduced thereby contributing to improvement of the reliability of the printed circuit board.

BRIEF DESCRIPTION OF THE DRAWINGS

The scope of the present invention will be apparent from the following detailed description, when taken in conjunction with the accompanying drawings, and such detailed description and specific examples, while indicating preferred embodiments of the invention, are given by way of illustration only, since various changes and modifications within the spirit and scope of the invention will become apparent to those skilled in the art from this detailed description, in which:

FIGS. 5A and 5B are diagrams for explaining paste filling property when the paste filling method of the present invention is actually applied;

FIG. 7 is a flow chart illustrating an operation of the soldering system.

DESCRIPTION OF THE PREFERRED EMBODIMENTS

Hereinafter, an embodiment of the present invention will be described with reference to the accompanying drawings.

Figure 1:
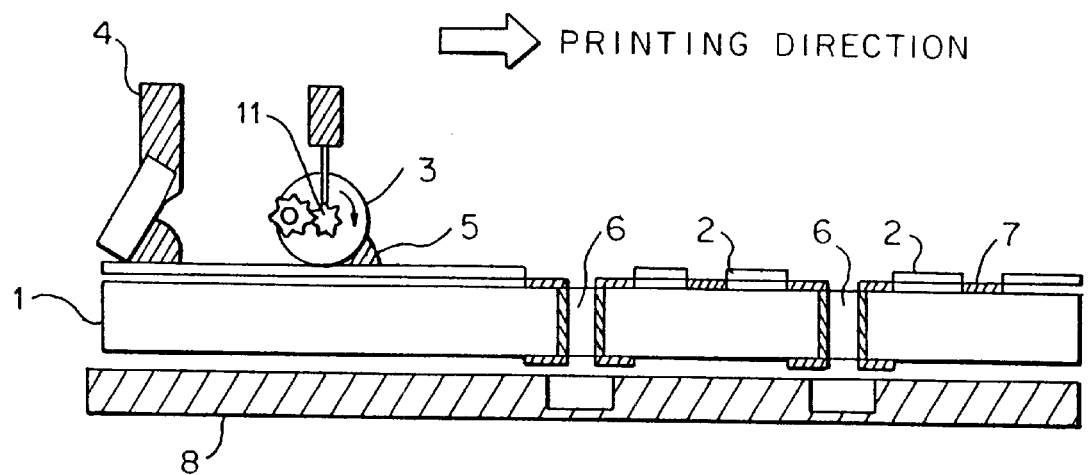
FIG. 1 is a diagram for explaining a method for filling a printed circuit board with paste, of the present invention.

Referring to FIG. 1, reference numeral 1 shows a printed circuit board in which surface mounting part lands and lead provided insertion part through holes coexist and the aspect ratio is 4. Numeral 2 denotes a printing mask having predetermined masks and numeral 3 denotes a printing roller which is forcibly rotated. A shadow portion thereabove indicates a holder. Numeral 4 denotes a printing squeegee and a shadow portion thereabove indicates a holder. Numeral 5 denotes solder paste and numeral 6 denotes a high aspect ratio through hole having a minute opening. Numeral 7 denotes a surface mounting part land and numeral 8 denotes a paste receiving plate.

The printed circuit board 1 and printing mask 2 are fixed to a printer (not shown in FIG. 1) and a pattern of the printing mask is matched with the through holes and surface mounting part lands and set thereon.

After that, the solder paste 5 is supplied and then the printing roller 3 which is forcibly rotated is swept (dragged) in a printing direction indicated by an arrow so as to supply the solder paste 5 to the surface mounting part lands 7, through holes 6 and paste receiving plate 8. It is permissible to sweep the printing squeegee 4 after the printing roller 3 which is forcibly rotated.

The printed circuit board 1 may be a printed circuit board provided with only the lead provided insertion part through holes or a printed circuit board provided with only the surface mounting part lands.

As for the forcible rotation of the printing roller 3, the peripheral velocity of the roller should be faster than the sweeping speed. It is more effective that to keep the peripheral velocity of the roller 4 to 10 times faster than the sweeping speed. When a shaft of roller is free from any power and the roller naturally rotates by sweeping movement, it provides an insufficient of paste.

According to this method, a sufficient amount of paste is loaded to the surface mounting part lands and through holes of the printed circuit board 1 in which the high aspect ratio through holes and surface mounting part lands coexist. At the same time, a sufficient amount of paste is also loaded onto the paste receiving plate 8 having a volume the same or larger than that of the through hole. The through hole and paste receiving plate can be loaded with solder paste more than twice the volume of the through hole.

The printing squeegee 4 supplies paste to the surface mounting part land 7 and sweeps so that no paste 5 remains on the printing mask 2.

Although an attack angle (angle formed by the printing squeegee 4 and printing mask 2) is desired to be 60°, if it is intended to further supply paste to the through hole 6, the attack angle is set to 45° or 30°.

For the surface mounting part land 7, an opening and thickness of the printing mask 2, corresponding to a required amount of paste are considered. The through hole 6 is formed so as to be equal to the diameter of the opening or as large as possible in such an extent-that no bridge or short occurs between the lands.

Next, an example of the soldering method after the solder paste is supplied will be described below.

Figure 2:
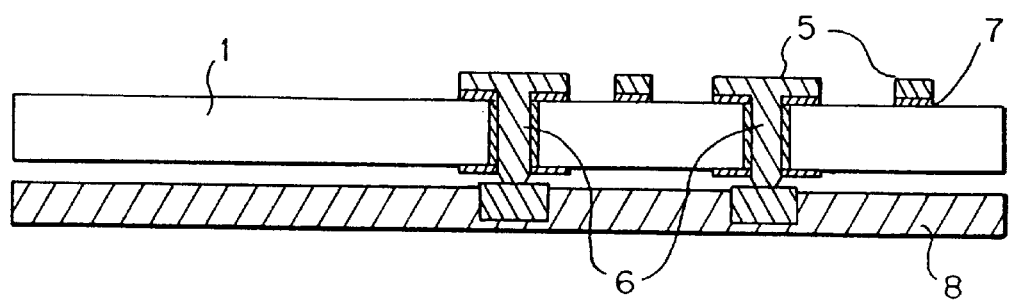
FIG. 2 is a view illustrating an example of a state after a printed circuit board is filled with paste.
Figure 3:
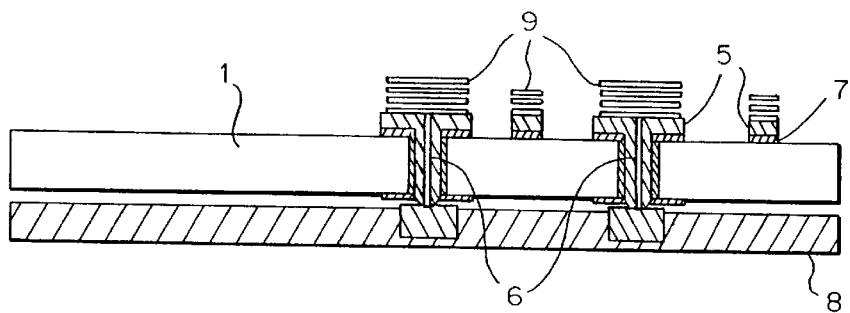
FIG. 3 is a view showing an example of a state with parts loaded (inserted) after paste is filled.

As shown in FIG. 2, the solder paste is printed on the printed circuit board 1 and paste receiving plate 8. Then, mounting parts 9 are loaded on the printed circuit board 1 and paste receiving plate 8 as shown in FIG. 3. That is, the surface mounting parts are mounted on the surface mounting part lands 7 and the lead provided insertion parts are inserted into the through holes 6. Then, the printed circuit board 1 and paste receiving plate 8 are set and solder melting procedure is carried out.

After that, the printed circuit board 1 and paste receiving plate 8 are separated from each other. As a result, the surface mounting parts and lead provided parts can be soldered to the printed circuit board 1 by a single soldering procedure.

According to the above described soldering method, the number of processes and working time are substantially reduced and frequency of thermal hysteresis is also reduced so that the reliability of the printed circuit board is improved. Meanwhile, the paste receiving plate 8 is formed of a material having a property of blocking solder from adhering and high-temperature resistance because solder is melted thereon.

Figures 4A, 4B, 4C, 4D:
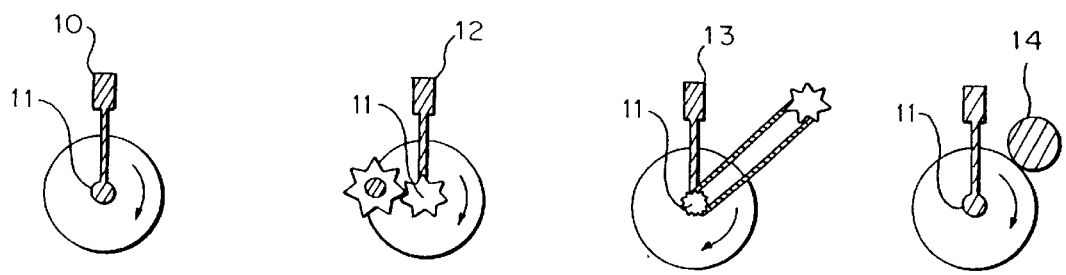
FIG. 4 is a diagram for explaining various roller forcible rotation methods of the present invention.

The forcible rotation methods for the roller illustrated in FIG. 4 will be described in detail.

There are various methods available for forcible rotation of the roller. Reference numeral 10 indicates motor contained type. The motor cause a shaft 11 of the roller to be rotated. According to methods 12, 13, 14, a driving system is placed at a location other than the shaft and the roller is rotated forcibly by power transmission. The methods 12, 13, 14 indicate gear type, belt type and contact type in which another roller is provided to rotate the roller, respectively.

Next, solder paste filling property of the printing roller 3 will be described with reference to FIGS. 5(A) and (B).

FIG. 5(A) shows conditions of solder filling tests and the tests results. The tests were practiced by 4 types of squeegees, one method using a flat squeegee and three methods using rollers A–C subject to various factors. Conditions of the tests, excluding roller peripheral velocity, are quite same. Printing frequency is one time (item 1). Printing speed is five mm/s (item 2). Roller diameter of each of the three rollers is 42φ (item 4). The load(pressure) given to the each of the squeegee and the rollers is also same. Each of the squeegee and rollers is given 50 g/mm per unit length of the squeegee or roller (FIG. 5(B)). The same paste is used for each squeegee and roller.

A shaft of Roller A is forced to rotate independent with Roller sweeping motion. Roller peripheral velocity of Roller A is 20 mm/s. It is four times as fast as the printing speed. A shaft of Roller B freely rotates. Roller peripheral velocity of Roller B is 5 mm/s. It is same speed with the printing speed. And Roller C is no rotation. A shaft of Roller C is fixed.

On conditions mentioned above, when the volume of the through hole is expressed as "1", the filling ratio by flat squeegee is around "0.4" (item 5). In the same way, the filling ratio by Roller C is around "0.85" and the filling ratio by Roller B is around "1.13". Each of them causes insufficiency of the application of paste. On the other hand, the filling ratio by Roller A becomes "2.5" and we can fill paste to the through holes sufficiently.

FIG. 5(B) visually illustrates the results. A horizontal axis shows the load given to each squeegee. A vertical axis shows paste filing ratio. V1 is the volume of through holes in the printed circuit board. The volume of each through hole is (φ0.75×t3.1). V2 is the volume of holes in the receiving jig. The volume of each hole in the receiving jig is (φ1.35×t1.3). Each hole in the receiving jig has about 1.25 times the volume in each through hole in the printed circuit board. Only Roller A could fill a sufficient amount of paste for the through holes and holes in the receiving jig.

As compared to the known squeegee, the printing roller of the present invention that is forced to rotate is capable of filling paste more sufficiently. The rotation speed of the printing roller is desired to be 4–10 times the sweeping speed so as to ensure low speed sweeping.

Further, this printing method is also available for filling a green sheet used upon production of a ceramic substrate.

Figure 6:
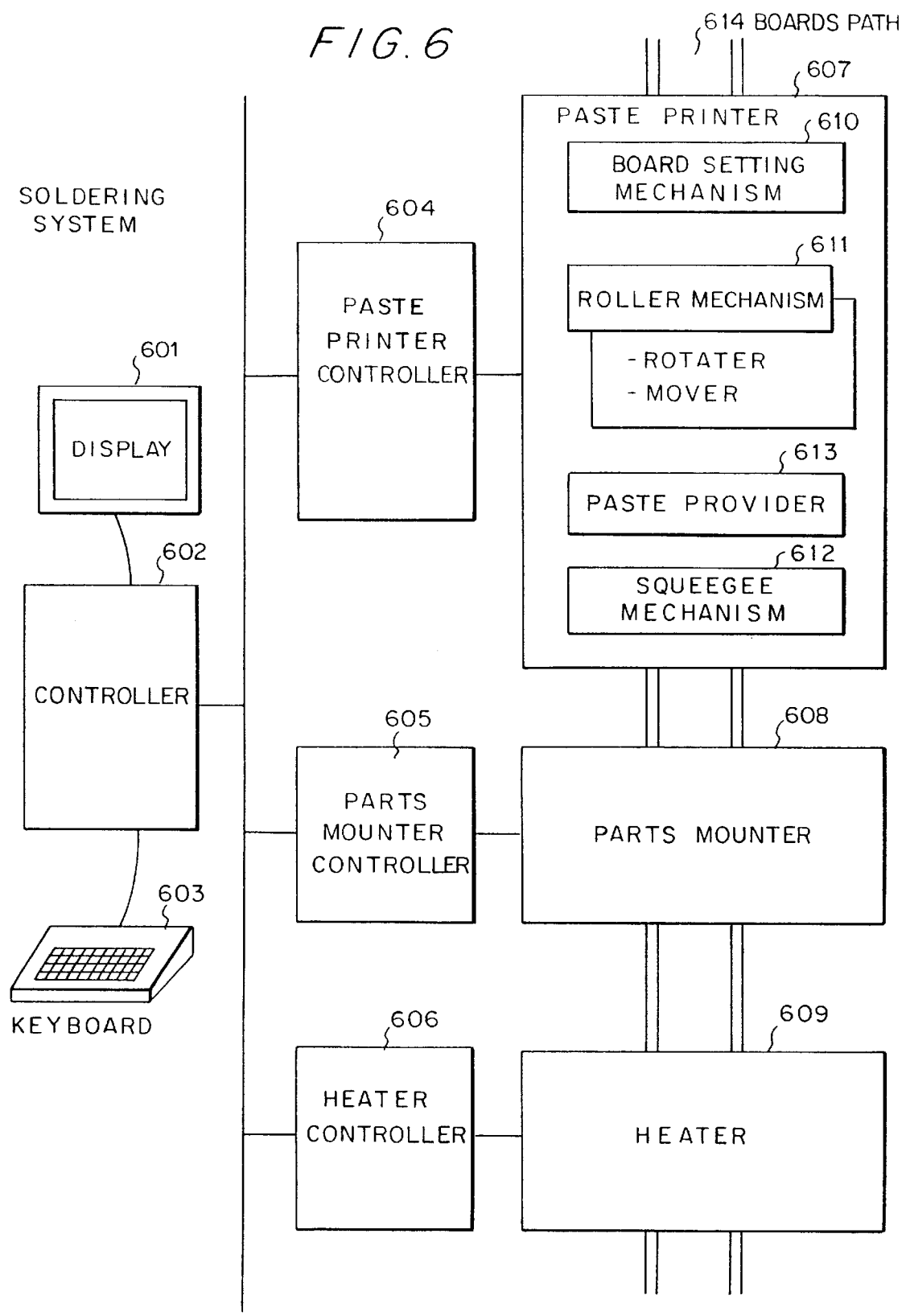
FIG. 6 is a diagram illustrating an overall construction of a soldering system.

FIG. 6 is a diagram illustrating an overall construction of a soldering system. In FIG. 6, 603 denotes a keyboard for inputting data and command for controlling the soldering system. 602 denotes a controller for controlling the whole soldering system according to information from the keyboard or other elements. 601 denotes a display for displaying various information from the controller 602. The information includes guidance for inputting data or commands.

604 denotes a paste printer controller which controls a paste printer 607. The Paste printer 607 includes following mechanisms. A board setting mechanism 610 sets a printed circuit board, a paste receiving board and a paste printing mask. A board setting mechanism 610 includes an adjuster for adjusting the position of the paste printing mask. A roller mechanism 611 moves a roller 3 from one end to another end on the printing mask adding a load which is a force applied to the printing mask 2 of the roller 11, for filling holes in the printing mask paste. A roller mechanism 611 has a rotation mechanism for rotating a shaft of the roller 11 dependent with transfer movement. Various types of rotation mechanisms have already been shown in FIG. 4. Paste provider 613 provides paste on the printing mask. The squeegee mechanism moves a squeegee 4 following the roller 3. The squeegee mechanism 612 adjusts an attack angle of the squeegee. The attack angle is a contact angle between the squeegee 4 and the printing mask 2 in printing direction. The squeegee mechanism 612 also adjusts a load which is a force applied to the printing mask 2 of the squeegee. The squeegee mechanism 612 removes rest paste on the printing mask 2. According to the attack angle, the squeegee further provides paste to the holes in the printing mask 2.

605 denotes a parts mounter controller which controls a parts mounter 608. The parts mounter 608 mounts electric parts on the printed circuit board 1. The electric parts includes both surface mounting parts and parts having leads for inserting into the through holes.

606 denotes a heater controller which controls a heater 609. The heater 609 heats and melts the paste printed on the printed circuit board 1 and fixes the parts to the printed circuit board 1.

FIG. 7 is a flow chart illustrating an operation of the soldering system.

First, a controller 602 urges an operator to input initial numerals for accomplishing this soldering process by displaying guidance on the display 601, and receives the numerals from the keyboard 603 (701). The numerals include roller transfer speed, roller rotation speed, roller pressure to the printing boards, squeegee transfer speed, squeegee pressure to the printing board, squeegee attack angle, and paste amount etc.

The controller 602 directs the paste printer controller 604 to set a paste receiving board, a printed circuit board, and a printing mask on the paste printer (702). The paste printer controller 604 sets a paste receiving board, a printed circuit board, and a printing mask on the paste printer 607 by controlling the board setting mechanism (703). A motion of the board setting mechanism includes to adjust the position of them. After they set, the paste printer controller 604 notifies completion to the controller 602 (703).

The controller 602 directs the paste printer controller 604 to print paste on the printing board (704). The controller 602 gives various numerals input in the previous step 701. For example, it gives the paste printer controller 604 roller rotation speed, roller transfer speed, squeegee transfer speed, squeegee attack angle etc.

The paste printer controller 604 performs paste printing by controlling the roller mechanism 611, the squeegee mechanism 612 and the paste provider 613 (705). The paste printer controller 604 move them according to the numerals received from the controller 602. After finishing the paste printing, the paste printer controller 604 remove the printing mask 2 from the printing board by controlling the board setting mechanism 610. Then, the paste printer controller 604 notifies completion to the controller 602 (705).

The controller 602 moves the printed circuit board with paste printed thereon, to the mounter 608 by using a board path 614. The controller 602 directs the mounter controller 605 to mount electric parts (706).

The part mounter controller 605 mounts the electric parts by controlling the part mounter 608 (707). The electric parts include both of surface mounting parts and parts having leads for inserting into the through holes. After all electric parts were set, the part mounter controller 605 notifies completion to the controller 602 (707).

The controller 602 moves the printing circuit board with parts mounted thereon, to the heater 609 by using the board path 614. The controller 602 direct the heater controller 606 to fix the electric parts to the printed circuit board (708).

The heater controller 606 heats and melts the paste by controlling the heater, thereby fixes the electric parts to the printed circuit board. The heater controller 606 notifies completion to the controller 602 (709).

The controller moves the printed circuit board from the heater by controlling the board path and sets all soldering process.

While the present invention has been described in detail and pictorially in the accompanying drawings, it is not limited to such details since many changes and modification recognizable to these of ordinary skill in the art may be made to the invention without departing from the spirit and scope of the invention, and all such modifications as would be obvious to one skilled in the art are intended to be included within the scope of the following claims.

We claim:

1. A soldering method for soldering parts on a circuit board having through holes and surface mounting part lands, comprising the steps of:

setting a printing mask having predetermined openings for said through holes and surface mounting part lands on the circuit board;

providing a solder paste on the printing mask;

dragging a roller along the surface of the printing mask and forcing the roller to rotate independent of the dragging so as to supply the solder paste to the through holes and the surface mounting part lands;

removing the printing mask from the board;

loading parts on said surface mounting part lands of said circuit board and inserting leads of the parts into the through holes; and heating and melting the solder paste on the circuit board so as to fix the parts to the circuit board, wherein a speed of peripheral velocity of the roller rotation is different than a speed of dragging.

2. A soldering method according to claim 1, wherein the speed of the peripheral velocity of the roller rotation is faster than the speed of dragging.

3. A soldering method according to claim 1, the method further comprising the step of:

dragging a squeegee along the surface of the printing mask between the dragging roller step and removing the printed mask step.

4. A soldering method according to claim 3, wherein a speed of peripheral velocity of the roller rotation is at least approximately 4 times faster than a speed of dragging.

5. A soldering method according to claim 2, wherein an attack angle of the squeegee is approximately between 60° against a surface of the printing mask.

6. A soldering method according to claim 2, wherein an attack angle of the squeegee is approximately between 30° and 40° against a surface of the printing mask.

7. A soldering method according to claim 2, wherein said dragging step includes supplying power to the roller for rotating movement.

8. A soldering method according to claim 7, wherein the speed of peripheral velocity of the roller rotation is faster than the speed of dragging.

9. A soldering method according to claim 8, wherein the speed of peripheral velocity of the roller rotation is at least approximately 4 times faster than the speed of dragging.

* * * * *